US012542259B2

(12) United States Patent
Hua et al.

(10) Patent No.: US 12,542,259 B2
(45) Date of Patent: Feb. 3, 2026

(54) PLASMA-EXCLUSION-ZONE RINGS FOR PROCESSING NOTCHED WAFERS

(71) Applicant: LAM RESEARCH CORPORATION, Fremont, CA (US)

(72) Inventors: Xuefeng Hua, Foster City, CA (US); Jack Chen, San Francisco, CA (US); Gnanamani Amburose, Fremont, CA (US); Dan Zhang, Fremont, CA (US); Chang-Wei Huang, Yongkang Dist. Tainan (TW); Chia-Shin Lin, Shilin Dist. (TW)

(73) Assignee: Lam Research Corporation, Fremont, CA (US)

( * ) Notice: Subject to any disclaimer, the term of this patent is extended or adjusted under 35 U.S.C. 154(b) by 540 days.

(21) Appl. No.: 17/913,935

(22) PCT Filed: Mar. 26, 2021

(86) PCT No.: PCT/US2021/024275
§ 371 (c)(1),
(2) Date: Sep. 23, 2022

(87) PCT Pub. No.: WO2021/195453
PCT Pub. Date: Sep. 30, 2021

(65) Prior Publication Data

US 2023/0352278 A1 Nov. 2, 2023

Related U.S. Application Data

(60) Provisional application No. 63/000,697, filed on Mar. 27, 2020.

(51) Int. Cl.
*H01J 37/32* (2006.01)

(52) U.S. Cl.
CPC .............................. *H01J 37/32642* (2013.01)

(58) Field of Classification Search
CPC ........... H01J 37/32091; H01J 37/32385; H01J 37/3244; H01J 37/32449; H01J 37/32541;
(Continued)

(56) References Cited

U.S. PATENT DOCUMENTS 6,344,105 B1 2/2002 Daugherty et al.
7,438,765 B2 10/2008 Park et al.
(Continued)

FOREIGN PATENT DOCUMENTS

CN 101308779 A 11/2008
JP 2014-017292 A 1/2014
(Continued)

OTHER PUBLICATIONS

Office Action issued in corresponding Taiwanese Patent App. No. 110111084 mailed on Dec. 15, 2024.
(Continued)

*Primary Examiner* — Benjamin Kendall

(57) ABSTRACT

A plasma-exclusion-zone ring for a substrate processing system that is configured to process a substrate includes a ring-shaped body, an upper portion of the ring-shaped body, a base and a plasma-exclusion-zone ring notch. The upper portion of the ring-shaped body defines a radially inner surface and a top surface. The base of the ring-shaped body defines a radially outer surface, a first bottom surface extending radially inward from the radially outer surface, and a second bottom surface extending radially inward from the first bottom surface. The plasma-exclusion-zone ring notch is proportional to an alignment notch of the substrate. The first bottom surface is tapered and extends at an acute angle from the second bottom surface to the radially outer surface. The first bottom surface is configured to extend over and oppose a periphery of the substrate.

38 Claims, 8 Drawing Sheets

(58) Field of Classification Search
CPC .......... H01J 37/32568; H01J 37/32642; H01L 21/68735
See application file for complete search history.

(56) References Cited

U.S. PATENT DOCUMENTS

| | | | | |
|---|---|---|---|---|
| 2005/0011453 | A1* | 1/2005 | Okumura | C23C 16/505 118/723 E |
| 2007/0141951 | A1 | 6/2007 | Naoki et al. | |
| 2009/0325382 | A1* | 12/2009 | Yu | H01L 21/6708 438/692 |
| 2011/0206833 | A1* | 8/2011 | Sexton | H01J 37/32862 427/78 |
| 2014/0007901 | A1 | 1/2014 | Chen et al. | |
| 2014/0011365 | A1 | 1/2014 | Yasui et al. | |
| 2015/0099365 | A1* | 4/2015 | Chen | H01J 37/32091 156/345.24 |
| 2016/0042927 | A1 | 2/2016 | Kim et al. | |
| 2018/0151335 | A1 | 5/2018 | Wu et al. | |
| 2018/0334746 | A1 | 11/2018 | Breiling et al. | |

FOREIGN PATENT DOCUMENTS

| | | | |
|---|---|---|---|
| KR | 10-0532354 | B1 | 11/2005 |
| TW | 200845188 | A | 11/2008 |
| TW | 2009487590 | | 11/2009 |

OTHER PUBLICATIONS

International Search Report and Written Opinion of the ISA issued in PCT/US2021/024275, mailed Jul. 15, 2021; ISA/KR.

* cited by examiner

PLASMA-EXCLUSION-ZONE RINGS FOR PROCESSING NOTCHED WAFERS

CROSS-REFERENCE TO RELATED APPLICATIONS

This application is a U.S. National Phase Application under 35 U.S.C. 371 of International Application No. PCT/US2021/024275, filed on Mar. 26, 2021, which claims the benefit of U.S. Provisional Application No. 63/000,697, filed on Mar. 27, 2020. The entire disclosures of the applications referenced above are incorporated herein by reference.

FIELD

The present disclosure relates to processing notched wafers.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, rapid thermal processing (RTP), ion implant, physical vapor deposition (PVD), and/or other etch, deposition, or cleaning processes. A substrate may be arranged on a substrate support, such as a pedestal, an electrostatic chuck (ESC), etc. in a processing chamber of the substrate processing system. During processing, gas mixtures including one or more precursors may be introduced into the processing chamber and plasma may be used to initiate chemical reactions.

SUMMARY

A plasma-exclusion-zone ring for a substrate processing system that is configured to process a substrate is provided. The plasma-exclusion-zone ring includes a ring-shaped body, an upper portion of the ring-shaped body, a base and a plasma-exclusion-zone ring notch. The upper portion of the ring-shaped body defines a radially inner surface and a top surface. The base of the ring-shaped body defines a radially outer surface, a first bottom surface extending radially inward from the radially outer surface, and a second bottom surface extending radially inward from the first bottom surface. The plasma-exclusion-zone ring notch is proportional to an alignment notch of the substrate. The first bottom surface is tapered and extends at an acute angle from the second bottom surface to the radially outer surface. The first bottom surface is configured to extend over and oppose a periphery of the substrate.

In other features, the base includes the plasma-exclusion-zone ring notch.

In other features, the plasma-exclusion-zone ring notch is proportional to an alignment notch of the substrate.

In other features, the plasma-exclusion-zone ring notch has a same profile as an alignment notch of the substrate.

In other features, the plasma-exclusion-zone ring notch is configured to increase an amount of etching or deposition at or near a notch of the substrate.

In other features, the plasma-exclusion-zone ring notch extends radially inward from the radially outer surface and the first bottom surface.

In other features, the plasma-exclusion-zone ring notch includes a single recessed surface configured to oppose the substrate. In other features, the plasma-exclusion-zone ring notch has varying depth from a radially innermost edge to a radially outermost edge.

In other features, the plasma-exclusion-zone ring notch has a non-varying depth from a radially innermost edge to a radially outermost edge.

In other features, the plasma-exclusion-zone ring notch includes recessed surfaces. One or more of the recessed surfaces is configured to oppose the substrate.

In other features, the recessed surfaces include: a first recessed surface extending at an acute angle relative to the substrate; and a second recessed surface extending parallel to the substrate.

In other features, the upper portion and the base form a radially-inner stepped surface. The radially-inner stepped surface (i) sits on and receives a flange of a dielectric component, and (ii) faces a radially outer surface of the dielectric component.

In other features, the upper portion and the base form a radially-inner stepped surface disposed a radial outer portion of the first bottom surface. The radially-inner stepped surface extends inwardly into the ring-shaped body between the radially outer surface and the top surface.

In other features, a substrate processing system includes: the plasma-exclusion-zone ring; and the substrate. The radially outer surface of the plasma-exclusion-zone ring guides processing gas towards a peripheral edge of the substrate.

In other features, the plasma-exclusion-zone ring includes a notch. The notch has a same profile as an alignment notch of the substrate.

In other features, a plasma-exclusion-zone ring for a substrate processing system is provided and is configured to process a substrate. The plasma-exclusion-zone ring includes a ring-shaped body and a plasma-exclusion-zone ring notch. The ring-shaped body defines: a radially inner surface; a radially outer surface; a top surface extending radially outward from the radially inner surface; a first bottom surface extending radially inward from the radially outer surface; and a second bottom surface extending radially inward from the first bottom surface. The second bottom surface is at a different angle than the first bottom surface. The plasma-exclusion-zone ring notch extends inwardly into the ring-shaped body from the radially outer surface and the first bottom surface. The plasma-exclusion-zone ring notch is configured to extend over, oppose and be aligned with an alignment notch of the substrate.

In other features, the first bottom surface is tapered and extends at an acute angle from the second bottom surface to the radially outer surface.

In other features, the plasma-exclusion-zone ring notch includes a single recessed surface configured to oppose the alignment notch of the substrate.

In other features, the plasma-exclusion-zone ring notch has varying depth from a radially innermost edge to a radially outermost edge.

In other features, the plasma-exclusion-zone ring notch has a non-varying depth from a radially innermost edge to a radially outermost edge.

In other features, the plasma-exclusion-zone ring notch includes: a first recessed surface and a second recessed surface; the first recessed surface extends at an acute angle relative to the substrate; the second recessed surface extends parallel to the substrate; and at least one of the first surface and the second surface is configured to oppose the alignment notch of the substrate.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A substrate processing system may include one or more PEZ rings. An upper PEZ ring may be disposed over a perimeter of a wafer and define an etch or deposition profile at and radially inward of a periphery of the wafer. An upper PEZ ring may include a flat bottom surface that extends parallel to an upper surface of the wafer. The wafer can include a wafer alignment notch (hereinafter "wafer notch"), which is used as a reference point for aligning the wafer. Processing behaviors at the wafer notch can be different than at other areas of the wafer. For example, a faster material removal rate during etching can occur at the wafer notch as compared to other areas of the wafer. As another example, adhesion can be poorer at a wafer notch during deposition resulting in less material being deposited as compared to other areas of the wafer. As a result, surface topography at and/or near the wafer notch can be different than other areas of the wafer, which are at a same radial distance from a center of the wafer. If deposited film coverage around a wafer notch is different than other areas of the wafer, then the dies at and around the wafer notch are impacted. For example, in a wafer-to-wafer bonding process, voids can occur around a wafer notch. As a result, dies in an area of the notch are discarded resulting in low yield.

The examples set forth herein include PEZ rings with tapered bottom surfaces and respective notches (referred to as PEZ ring notches) to increase plasma diffusion at and near wafer notches for improved etch rate and deposition rate uniformity. The PEZ ring notches have the same or similar profiles as corresponding wafer notches and are larger than the wafer notches to provide consistent etch and deposition performance at and around the wafer notches for increased yield. The PEZ rings notches have one or more recessed sections with corresponding depths. The depths may be non-varying or varying, as further described below. The PEZ ring notches are aligned with the wafer notches and increase etching and deposition at and near wafer notches for improved etch and deposition uniformity at and around the wafer notches.

Figure 1:
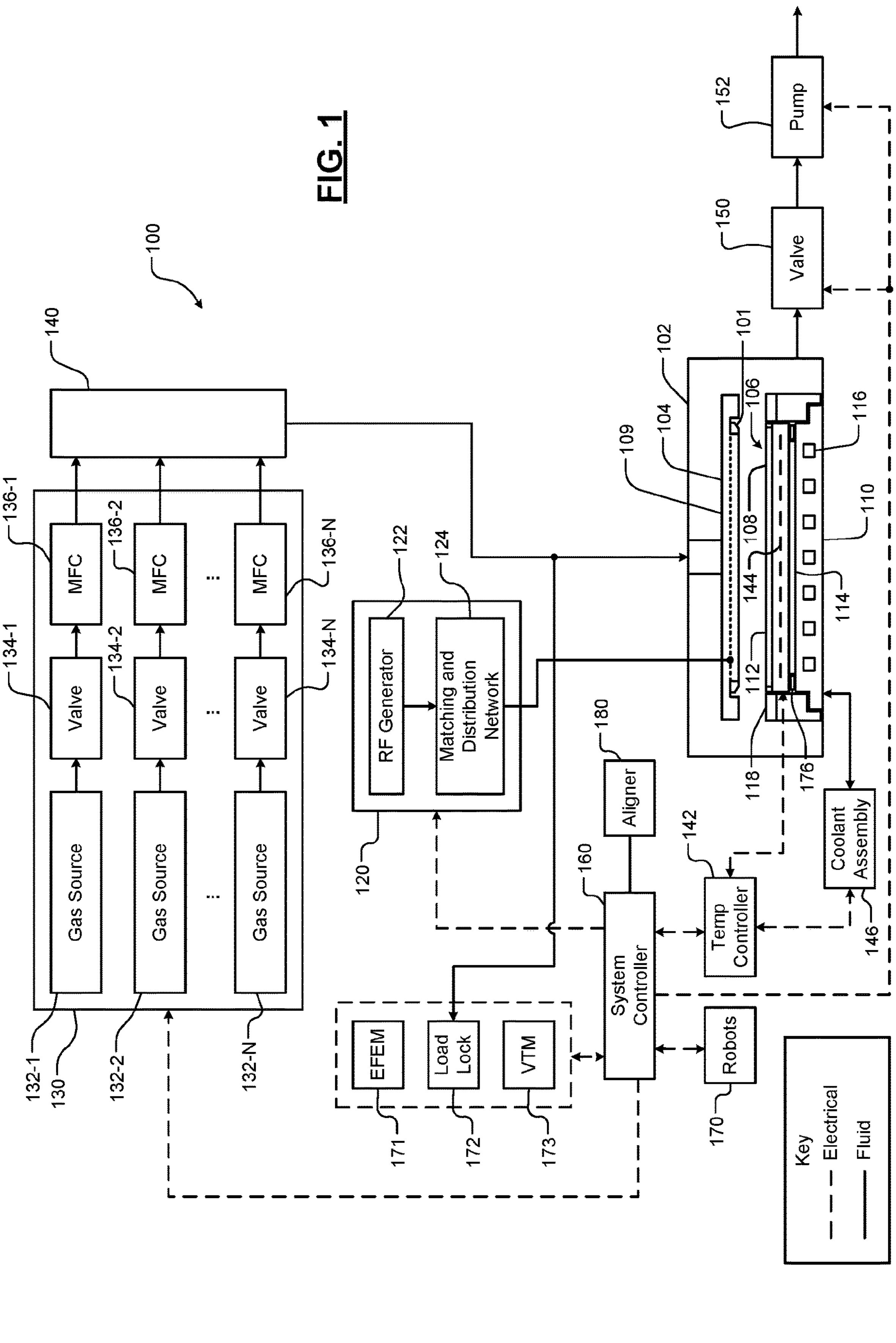
FIG. 1 is a functional block diagram of an example substrate processing system including a substrate support in accordance with the present disclosure.

FIG. 1 shows a substrate processing system 100 including a PEZ ring 101 having a bottom surface that is tapered. The PEZ ring 101 includes a PEZ ring notch, examples of which are shown in FIGS. 2-8. For example only, the substrate processing system 100 may be used for performing etch and/or deposition processing using RF plasma and/or other suitable substrate processing. The PEZ ring 101 is used to control an etch rate and/or a deposition rate at peripheries of substrates. The PEZ ring 101 and the other PEZ rings disclosed herein may each include a ring-shaped body formed of aluminum oxide, aluminum nitride, silicon, silicon carbide, silicon nitride, and/or yttria.

The substrate processing system 100 includes a processing chamber 102 that encloses components of the substrate processing system 100 and contains the RF plasma. The processing chamber 102 includes an upper electrode 104 and a substrate support 106, which may be an electrostatic chuck (ESC). During operation, a substrate 108 is arranged on the substrate support 106. While a specific substrate processing system 100 and processing chamber 102 are shown as an example, the principles of the present disclosure may be applied to other types of substrate processing systems and chambers, such as a substrate processing system that generates plasma in-situ, that implements remote plasma generation and delivery (e.g., using a plasma tube, a microwave tube), etc.

For example only, the upper electrode 104 may include the PEZ ring 101 and a gas distribution device such as a showerhead 109 that introduces and distributes process gases. The showerhead 109 may include a stem portion including one end connected to a top surface of the processing chamber 102. A base portion is generally cylindrical and extends radially outwardly from an opposite end of the stem portion at a location that is spaced from the top surface of the processing chamber 102. A substrate-facing surface or faceplate of the base portion of the showerhead 109 includes holes through which process gas or purge gas flows. Alternately, the upper electrode 104 may include a conducting plate and the process gases may be introduced in another manner.

The substrate support 106 includes a conductive baseplate 110 that acts as a lower electrode. The baseplate 110 supports a top plate 112, which may be formed of ceramic. In some examples, the top plate 112 may include one or more heating layers, such as a ceramic multi-zone heating plate. The one or more heating layers may include one or more heating elements, such as conductive traces, as further described below.

A bond layer 114 is disposed between and bonds the top plate 112 to the baseplate 110. The baseplate 110 may include one or more coolant channels 116 for flowing coolant through the baseplate 110. The substrate support 106 may include an edge ring 118 arranged to surround an outer perimeter of the substrate 108.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources supply one or more gas mixtures. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to heating elements, such as thermal control elements (TCEs) 144 arranged in the top plate 112. For example, the heating elements may include, but are not limited to, macro heating elements corresponding to respective zones in a multi-zone heating plate and/or an array of micro heating elements disposed across multiple zones of a multi-zone heating plate. The temperature controller 142 may be used to control the heating elements to control a temperature of the substrate support 106 and the substrate 108.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. One or more robots 170 may be used to deliver substrates onto, and remove substrates from, the substrate support 106. For example, the robots 170 may transfer substrates between an equipment front end module (EFEM) 171 and a load lock 172, between the load lock and a vacuum transfer module (VTM) 173, between the VTM 173 and the substrate support 106, etc. Although shown as separate controllers, the temperature controller 142 may be implemented within the system controller 160. In some examples, a protective seal 176 may be provided around a perimeter of the bond layer 114 between the top plate 112 and the baseplate 110.

The substrate processing system 100 may include an aligner 180 for aligning the PEZ ring 101 to the substrate 108. This includes aligning a PEZ ring notch of the PEZ ring 101 to an alignment notch of the substrate 108. The alignment may be controlled by the system controller 160 and may be controlled for each PEZ ring and corresponding substrate. This is especially true for a substrate processing system and/or processing chamber that includes multiple substrate supports and respective PEZ rings for controlling etch and deposition performance at peripheries of corresponding substrates. As an example, the system controller 160 may determine an offset between the PEZ ring notch and the alignment notch of the substrate 108 and rotate the PEZ ring 101 or the substrate 108, such that the PEZ ring notch is in alignment with the alignment notch, as further described below.

Figure 2:
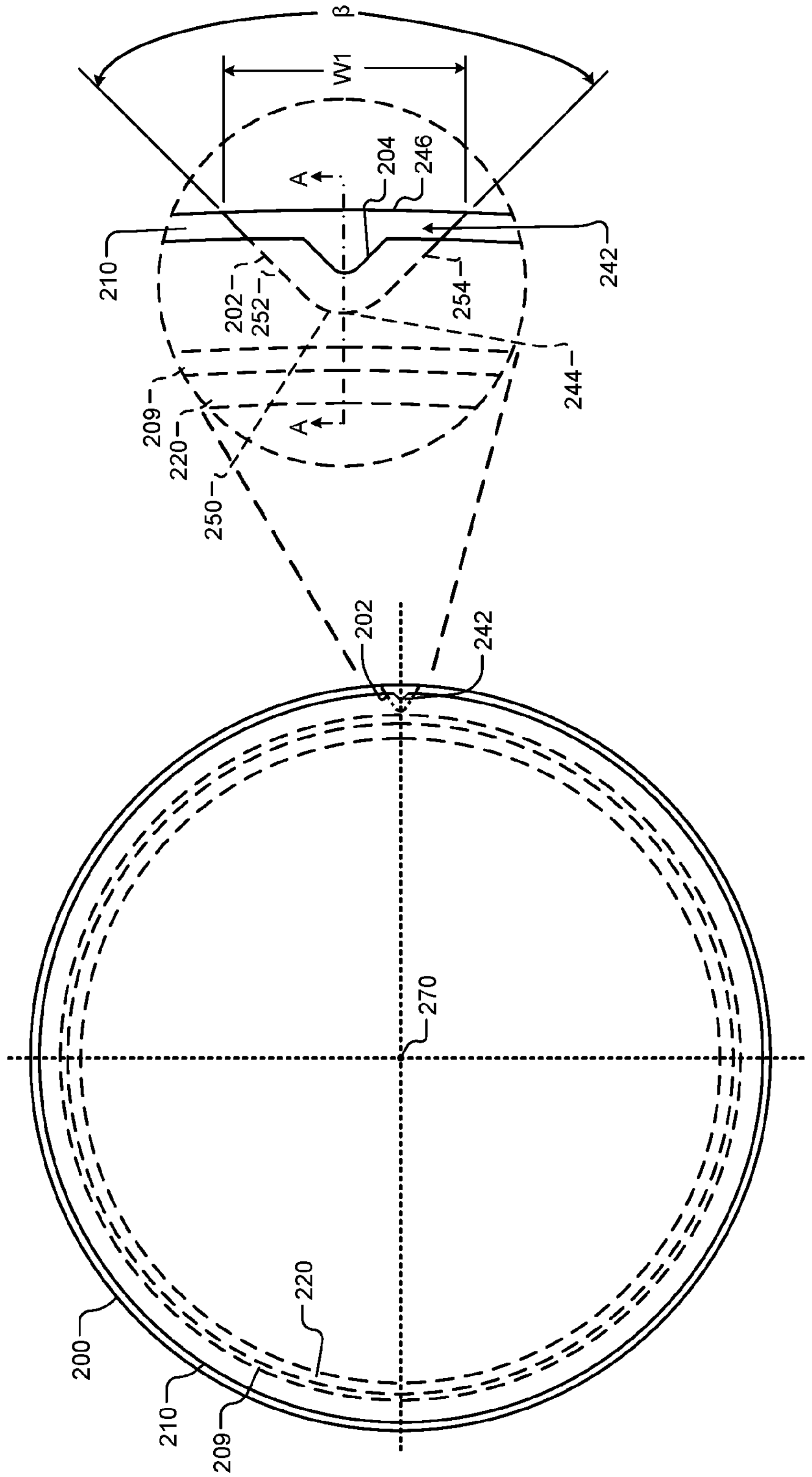
FIG. 2 is a bottom view of a plasma-exclusion-zone (PEZ) ring including a single section PEZ ring notch with varying depth in accordance with the present disclosure.
Figure 3:
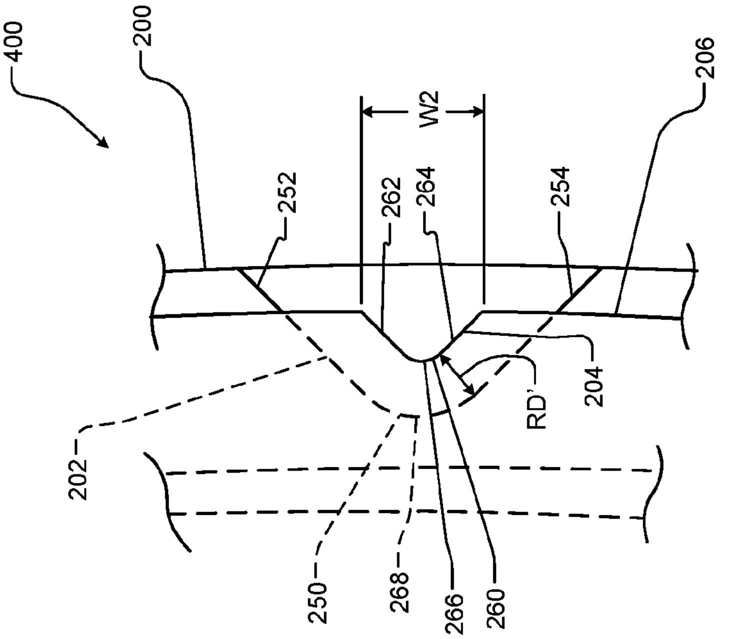
FIG. 3 is a bottom view of a portion of the PEZ ring of FIG. 2 illustrating a PEZ ring notch profile and a corresponding wafer notch profile.
Figure 4:
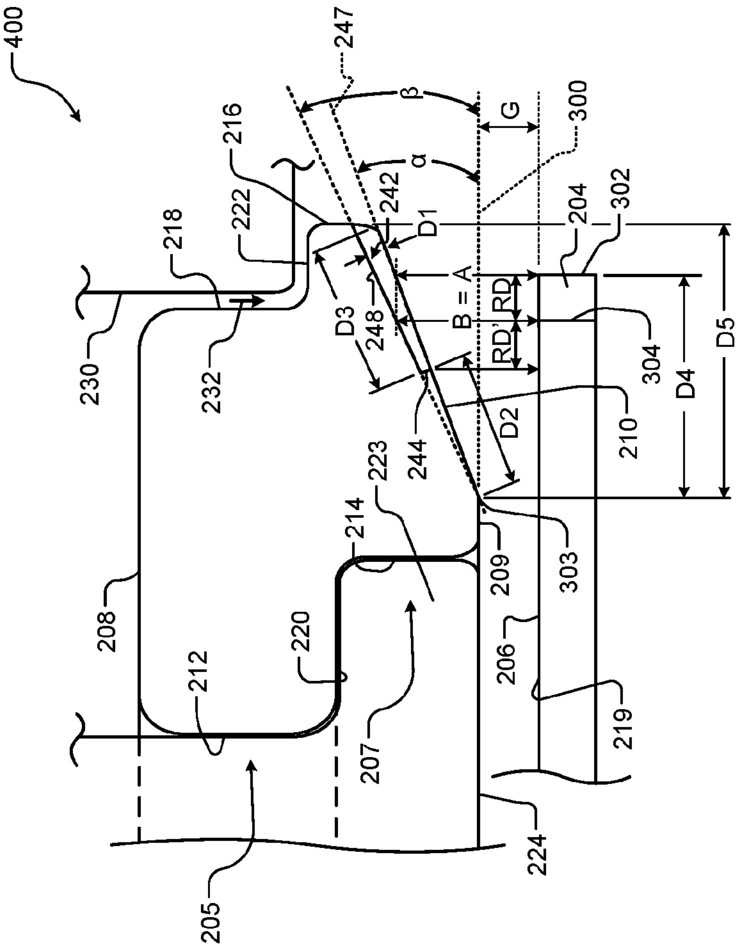
FIG. 4 is a cross-sectional view of a portion of the PEZ ring of FIG. 2 at section line A-A of FIG. 2.

FIGS. 2-4 show a PEZ ring 200 that includes a PEZ ring notch 202 that corresponds to a wafer notch 204 of a wafer 206 (shown in FIG. 3). The PEZ ring 200 includes an upper portion 205, a base 207, an uppermost surface 208, a bottom (or bottommost) surface 209, a tapered bottom surface 210, an innermost radial surface 212, an inner radial surface 214, an radially outermost surface 216, and an outer radial surface 218. The bottom surface 209 extends radially from the inner radial surface 214 to the tapered bottom surface 210. In an embodiment, the bottom surface 209 extends horizontally and/or parallel to a top surface 219 of the wafer 206. An inner bottom surface 220 of the PEZ ring 200 extends radially outward from the innermost radial surface 212 to the inner radial surface 214. A radially outer top surface 222 of the PEZ ring 200 extends radial inward from the radially outermost surface 216 to the outer radial surface 218. Corners between the stated surfaces may be rounded as shown for some of the corners.

The inner bottom surface 220 and the inner radial surface 214 form a notch that receives a portion (or flange) 223 of a dielectric component 224, which may be a component of the showerhead 109 of FIG. 1. The dielectric component 224 may be a circular-shaped plate and include holes for delivering gas to a processing chamber. The dielectric component 224 supports and holds the PEZ ring 200 in place. The PEZ ring 200 sits on the flange 223. The outer radial surface 218 and the top surface 222 form a channel with an opposing ring 230 through which process gases flow, as represented by arrow 232. The process gases flow along the outer radial surface 218, the top surface 222 and the radially outermost surface 216 and are directed down toward an outer periphery of the wafer 206.

Although the PEZ ring 200 and the dielectric component 224 are shown as separate components, in one embodiment, the PEZ ring 200 and the dielectric component 224 are integrally formed as a single component. In another embodiment, the PEZ ring 200 is attached and/or fused to the dielectric component 224. For example, radially inner most surfaces, such as surfaces 212, 214, and 220 may be attached and/or fused to radially outer most surfaces of the dielectric component 224. By providing the PEZ ring 200 and the dielectric component 224 as separate components, the PEZ ring 200 may be replaced without replacing the dielectric component 224. This reduces operating costs, since the PEZ ring 200 tends to be exposed to a harsh plasma condition not experienced by the dielectric component 224. This is due to the arrangement of the PEZ ring 200 relative to the dielectric component 224 and the flow of process gas along the outer radial surface 218 of the PEZ ring 200. When attached and/or fused together or formed as a single component, the PEZ ring 200 and the dielectric component 224 may be collectively referred to as a PEZ assembly. The stated possible relationships between the PEZ ring 200 and the dielectric component 224 apply to other PEZ rings disclosed herein.

The PEZ ring notch 202 has a recessed section 242 with varying depth D1 that gradually increases from a radially innermost edge 244 to the radially outermost surface 216 and/or a radially outermost edge 246. An example varying depth D1 is shown and is measured at a radial cross-section of the PEZ ring 200 from (i) a reference line 247 to (ii) a recessed surface 248 of the PEZ ring notch 202. The cross-section of the PEZ ring 200 is taken perpendicular to the uppermost surface 208 and the bottom (or bottommost) surface 209, such as the cross-section at the line A-A of FIG. 2. The reference line 247 is parallel to and includes a tangential intersection line, which is provided by a tangential intersection of a flat reference plane extending tangential to the tapered bottom surface 210 at the cross-section. In an embodiment, a profile (or shape) of the PEZ ring notch 202 when viewed from the bottom of the PEZ ring 200, matches a profile (or shape) of the wafer notch 204. In the example shown, the PEZ ring notch 202 and the wafer notch 204 are V-shaped. The PEZ ring notch 202 is larger, but has dimensions that are proportional to that of the wafer notch 204. The PEZ ring notch 202 may have a curved inner portion (or surface) 250 and two laterally extending surfaces 252, 254 that extend from the curved inner portion 250 to the radially outermost edge 246. The curved inner portion 250 and the laterally extending surfaces 252, 254 correspond respectively to a curved inner portion 260 and laterally extending edges 262, 264 of the wafer notch 204. A center point of the PEZ ring 200 is vertically in-line with a center point of the wafer 206. Both center points are represented by point 270 in FIG. 2. A width W of the PEZ ring notch 202 is shown measured at the radially outermost edge 246 and is proportional to a width W2 of the wafer notch 204. The top edges of the surfaces 250, 252, 254 may be rounded.

An angle α exists between (i) a lateral line 300 extending from and parallel to the bottom surface 209 and (ii) the tapered bottom surface 210. An angle β exists between the lateral line 300 and the recessed surface 248. As an example, the angle α may be 15-25° and the angle β may be 20-40°, although the angles α, β may be other acute angles. The radially innermost edge 244 of the recessed section 242 is (i) a predetermined distance D2 from the bottom surface 209 and/or (ii) a predetermined distance D3 from the radially outermost edge 246 and/or radially outermost surface 216. The distance D3 may include a portion or all of the radially outermost edge 246, which may be rounded. Each of the distances D2 and D3 varies in an azimuthal direction along the PEZ ring notch 202. A distance A exists vertically between a radially outermost edge 302 of the wafer 206 and the tapered bottom surface 210. A distance B exists vertically between the recessed surface 248 and the radially innermost edge 244 of the wafer notch 204. In one embodiment, the distance B is equal to the distance A. A gap G (e.g., 0.5-1.0 millimeters (mm)) exists between the bottom surface 209 and the wafer 206. The vertices of the angles α, β are at a same point 303 and are a predetermined distance D4 from the radially outermost edge 302 of the wafer 206. The vertices of the angles α, β are a predetermined distance D5 from the radially outermost surface 216 of the PEZ ring 200.

The tapered bottom surface 210 is inclined such that distance between the tapered bottom surface 210 and the wafer 206 increases from the point 303 to the radially outermost surface 216. By having the tapered bottom surface 210, as represented by angle α (referred to as the taper angle of the PEZ ring 200), increased etching and deposition occurs at and around the wafer notch 204 as compared to when a PEZ ring with a non-tapered bottom surface is used. An example of a PEZ ring that has a non-tapered bottom surface is one where the bottom surface 209 extends horizontally until reaching a radially outermost vertically extending surface of the PEZ ring. The recessed section 242 increases etch and deposition rates radially inward of the radially outermost edge 302 to allow the amount of etch and depositing to be maintained at a constant rate from an radially outermost edge 302 of the wafer 206 to at least twice a radial depth RD of the wafer notch 204 from the radially outermost edge 302. RD' represents a distance from the radial depth RD to a point below the radially innermost edge 244 of the recessed section 242 and may be greater than or equal to the radial depth RD. As an example, the radial depth RD may be 1.0-2.0 mm for a 300 mm diameter wafer. The PEZ ring notch 202 is configured to increase an etch rate and/or deposition rate at the radial depth RD to be a same etch rate and/or deposition rate as provided at the outer edge and/or periphery of the PEZ ring 200 to provide etch and deposition rate uniformity in an area at and away from the PEZ ring notch 202. The etch rate and/or deposition rate at the radial depth RD' and/or a larger radial depth near the PEZ ring notch 202 are maintained to be the same as that of other locations of the PEZ ring 200.

In one embodiment, the taper angle α is determined based on processing requirement, such as etch rates and/or deposition rates near an edge or outer periphery of a wafer. By having the bottom surface of the PEZ ring 200 tapered as shown, a minimal and/or gradual change in etch rates and deposition rates from the radially outermost edge 302 of the wafer 206 radially inward is provided. Angle β may be determined as shown in FIG. 4 based on the processing requirements, the taper angle α, the distance A, the radius of a radially innermost edge 304 of the wafer notch 204, the radius of the radially outermost edge of the bottom surface 209, and/or a radius of the radially innermost edge at point 303 of the tapered bottom surface 210. In one embodiment, the distance B is set equal to the distance A and the angle β is determined based on this relationship. The recessed section 242 is then formed based on these determined parameters.

The radially outermost surface 216 is radially outward of the radially outermost edge 302 of the wafer 206. The outermost edge of bottom surface 209 and radially innermost edge 244 of recessed section 242 are radially inward of the wafer notch 204. The substrate support 106 of FIG. 1 is configured to hold the wafer 206 relative to the PEZ ring 200 such that the wafer notch 204 is below and in alignment with the PEZ ring notch 202. In this state, the whole wafer notch 204 is below the recessed section 242. This alignment is shown in FIG. 3, where the innermost point 266 of the curved inner portion 260 of the wafer notch 204 is in a same vertical plane as an innermost point 268 of the curved inner portion 250 of the PEZ ring notch 202. This may be accomplished via an aligner 180 of the substrate processing system of FIG. 1, which may be controlled by the system controller 160.

Figure 5:
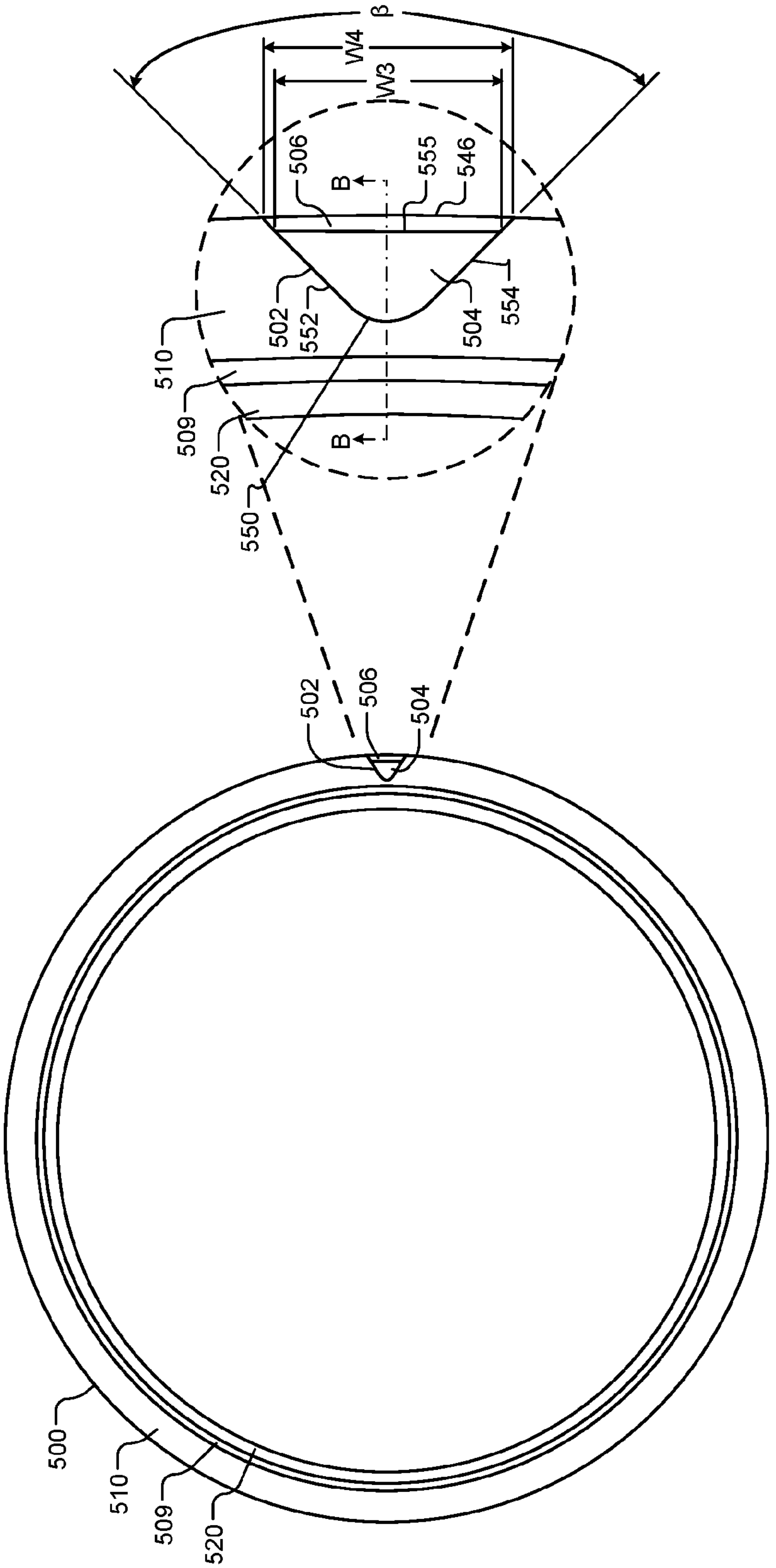
FIG. 5 is a bottom view of another PEZ ring including a multi-section PEZ ring notch in accordance with the present disclosure.
Figure 6:
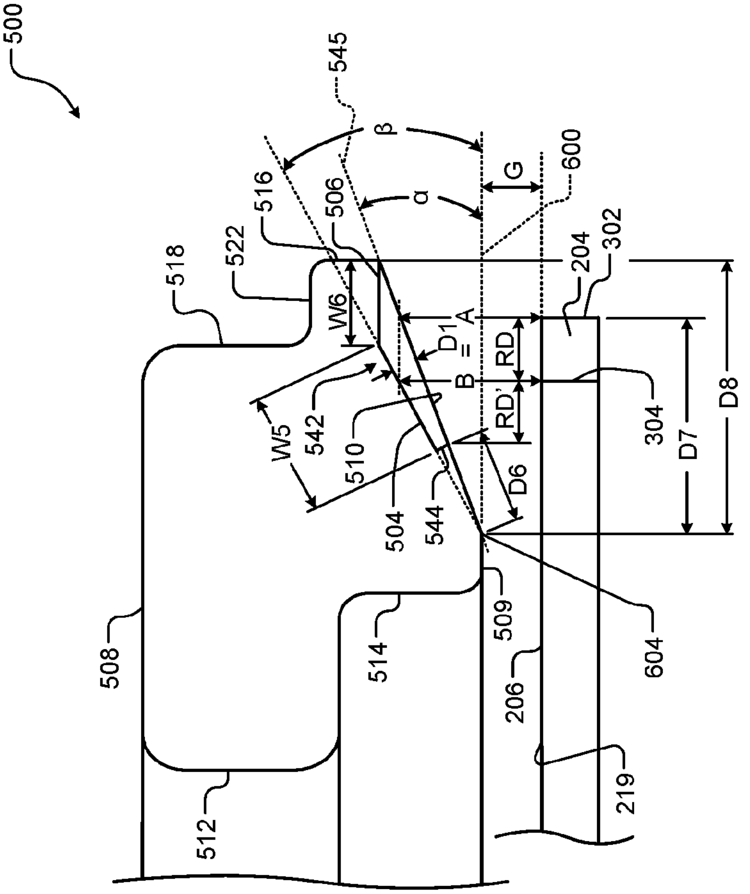
FIG. 6 is a cross-sectional view of a portion of the PEZ ring of FIG. 5 at section line B-B of FIG. 5.

FIGS. 5-6 show a PEZ ring 500 including a multi-section PEZ ring notch 502. The PEZ ring notch 502 is similar to the PEZ ring notch 202 of FIGS. 2-4, except the PEZ ring notch 502 has multiple sections with recessed surfaces at different angles. Although the PEZ ring notch 502 is shown having two recessed surfaces 504, 506, the PEZ ring notch 502 may have two or more recessed surfaces at two or more different angles.

The PEZ ring 500 includes an uppermost surface 508, a bottom (or bottommost) surface 509, a tapered bottom surface 510, an innermost radial surface 512, an inner radial surface 514, an radially outermost surface 516, and an outer radial surface 518. The bottom surface 509 extends radially from the inner radial surface 514 to the tapered bottom surface 510. In an embodiment, the bottom surface 509 extends horizontally. An inner bottom surface 520 of the PEZ ring 500 extends radially outward from the innermost radial surface 512 to the inner radial surface 514. A radially outer top surface 522 of the PEZ ring 500 extends radial inward from the radially outermost surface 516 to the outer radial surface 518. Corners between the stated surfaces may be rounded as shown for some of the corners. In an embodiment, the corner between the surfaces 506, 516 is not rounded. The angle between the surfaces 506, 516 may be 85-95°.

The inner bottom surface 520 and the inner radial surface 514 form a notch that receives a portion (or flange), such as the flange 223 shown in FIG. 4. The PEZ ring 500 sits on the flange. The outer radial surface 518 and the top surface 522 form a channel with an opposing ring, such as ring 230 of FIG. 4, through which process gases flow. The process gases flow along the outer radial surface 518, the top surface 522 and the radially outermost surface 516 and are directed down toward an outer periphery of the wafer 206.

The PEZ ring notch 502 has a recessed section 542. The recessed section 542 includes the recessed surfaces 504, 506. The depth of the recessed section 542 gradually increases from a radially innermost edge 544 to the recessed surface 506 at which point the depth of the recessed section 542 gradually decreases to the radially outermost surface 516. An example varying depth D1 is shown. The depth D1 may be measured at a radial cross-section of the PEZ ring 500 from (i) a reference line 545 to (ii) either (a) the recessed surface 504 of the PEZ ring notch 502 or (b) the recessed surface 506 of the PEZ ring notch 502, depending on where the depth D1 is measured along the plane 545. The cross-section of the PEZ ring 500 is taken perpendicular to the uppermost surface 508 and the bottom (or bottommost) surface 509, such as the cross-section at the line B-B of FIG. 5. The reference line 545 is parallel to and includes a tangential intersection line, which is provided by a tangential intersection of a flat reference plane extending tangential to the tapered bottom surface 510 at the cross-section.

In an embodiment, a profile (or shape) of the PEZ ring notch 502 when viewed from the bottom of the PEZ ring 500, matches a profile (or shape) of the wafer notch 204. In the example shown, the PEZ ring notch 502 and the wafer notch 204 are V-shaped. The PEZ ring notch 502 is larger, but has dimensions that are proportional to that of the wafer notch 204. The PEZ ring notch 502 may have a curved inner portion (or surface) 550 and two laterally extending surfaces 552, 554 that extend from the curved inner portion 550 to the radially outermost edge 546. An example vertical profile of the laterally extending surfaces 552, 554 is shown in FIG. 5. The laterally extending surfaces 552, 554 may have other vertical profiles with different shapes, which may be tuned to adjust amounts of etching and deposition. The curved inner portion 550 and the laterally extending surfaces 552, 554 correspond respectively to the curved inner portion 260 and laterally extending edges 262, 264 of the wafer notch 204 shown in FIG. 3. A width W3 of the recessed surface 504 is shown and is measured at an edge 555, where the recessed surface 504 meets the recessed surface 506. A width W4 is shown measured at the radially outermost edge 546 and is proportional to the width W2 (shown in FIG. 3) of the wafer notch 204. The top edges of the surfaces 550, 552, 554 may be rounded.

An angle α exists between (i) a lateral line 600 extending from and parallel to the bottom surface 509 and (ii) the tapered bottom surface 510. An angle β exists between the lateral line 600 and the recessed surface 504. The surface 506 may extend parallel to the lateral line 600 and parallel to the top surface 219 of the wafer 506. In one embodiment, the surfaces 506 and 509 extend horizontally.

As an example, the angle α may be 15-25° and the angle β may be 20-40°, although the angles α, β may be other acute angles. The radially innermost edge 544 of the recessed section 542 is a predetermined distance D6 from the bottom surface 509. The distance D6 may be adjusted thereby adjusting a width W5 of the recessed surface 504. Each of the distance D6 and the width W5 varies in an azimuthal direction along the PEZ ring notch 502. A distance A exists vertically between the radially outermost edge 302 of the wafer 206 and the tapered bottom surface 510. A distance B exists vertically between the recessed surface 504 and the radially innermost edge 244 of the wafer notch 204. In one embodiment, the distance B is equal to the distance A. A gap G exists between the bottom surface 509 and the wafer 206. The vertices of the angles α, β are at a same point 604 and are a predetermined distance D7 from the radially outermost edge 302 of the wafer 206. The vertices of the angles α, β are a predetermined distance D8 from the radially outermost surface 516 of the PEZ ring 500.

A width W6 of the recessed surface 506 is shown and may be adjusted. In the Example shown, the radially outermost edge 302 of the wafer 206 is under the recessed surface 506 and the radially innermost edge 304 of the wafer notch 204 is under the recessed surface 504. In another embodiment, both the radially outermost edge 302 and the radially innermost edge 304 are under the recessed surface 504. In another embodiment, both the radially outermost edge 302 and the radially innermost edge 304 are under the recessed surface 506.

The edge 555 at which the recessed surface 504 meets the recessed surface 506, may refer to an edge at which increasing the depth of the recessed section 542 has minimal or no affect on etch and/or deposition rates. In an area of the wafer 206 below the recessed surface 506. For example, if the recessed surface 504 is laterally extended to the radially outermost surface 516, such that the recessed surface 506 is removed, the corresponding etch and/or deposition rates may be minimally or not affected. This is in contrast, to changing the angle and/or shape of the recessed surface 504 radially inward of the radially outermost edge 302, which does substantially change the etch and deposition rates in an area of the wafer 206 below the recessed surface 504.

The recessed section 542 increases etch and deposition rates radially inward of the radially outermost edge 302 to allow the amount of etching and depositing to be maintained at a constant rate from an radially outermost edge 302 of the wafer 206 to at least twice a radial depth RD of the wafer notch 204 from the radially outermost edge 302. RD' represents a distance from the radial depth RD to a point below the radially innermost edge 544 of the recessed section 542, which may be greater than or equal to the radial depth RD. As an example, the radial depth RD may be 1.0-2.0 mm.

In one embodiment, the taper angle α is determined based on processing requirement, such as etch rates or deposition rates near an edge or outer periphery of a wafer. By having the bottom surface of the PEZ ring 500 tapered as shown, a minimal and/or gradual change in etch rates and deposition rates from the radially outermost edge 302 of the wafer 206 radially inward is provided. Angle β may be determined as shown in FIG. 6 based on the processing requirements, the taper angle α, the distance A, the radius of the radially innermost edge 304 of the wafer notch 204, the radius of the radially outermost edge of the bottom surface 509, and/or a radius of the radially innermost edge at point 604 of the tapered bottom surface 510. In one embodiment, the distance B is set equal to the distance A and the angle β is determined based on this relationship. The recessed section 542 is then formed based on these determined parameters.

The radially outermost surface 516 is radially outward of the radially outermost edge 302 of the wafer 206. The outermost edge of bottom surface 509 and the radially innermost edge 544 of recessed section 542 are radially inward of the wafer notch 204. The substrate support 106 of FIG. 1 is configured to hold the wafer 206 relative to the PEZ ring 500 such that the wafer notch 204 is below and aligned with the PEZ ring notch 502. The whole wafer notch 204 is positioned below the recessed section 542.

Figure 7:
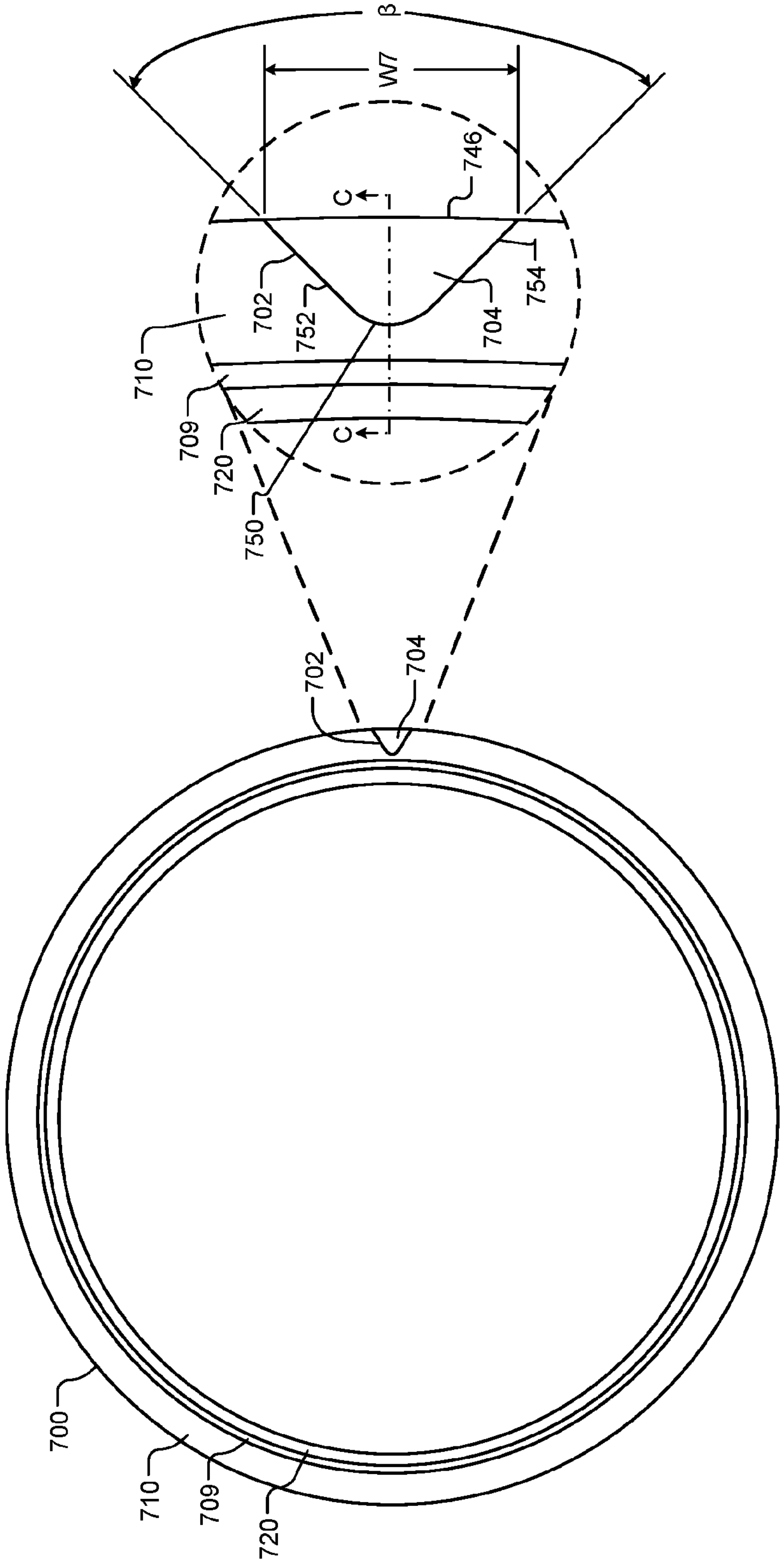
FIG. 7 is a bottom view of a PEZ ring including a single section PEZ ring notch with non-varying depth in accordance with the present disclosure.
Figure 8:
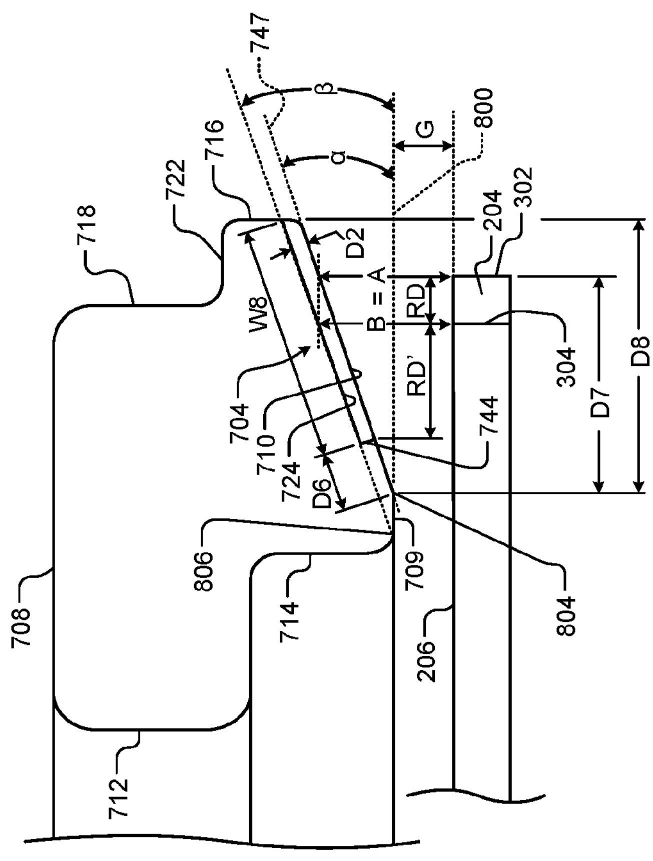
FIG. 8 is a cross-sectional view of a portion of the PEZ ring of FIG. 7 at section line C-C of FIG. 7.

FIGS. 7-8 show a PEZ ring 700 including a PEZ ring notch 702 having a single recessed section 704 with a non-varying depth D1'. The PEZ ring 700 is easier to manufacture than the PEZ ring 500 of FIGS. 5-6 due to the PEZ ring 700 having a single recessed section notch with a non-varying depth. The PEZ ring notch 702 is similar to the PEZ ring notches 202 and 502 of FIGS. 2-6, except the PEZ ring notch 702 has a single recessed section with a recessed surface and a non-varying depth D1'.

The PEZ ring 700 includes an uppermost surface 708, a bottom (or bottommost) surface 709, a tapered bottom surface 710, an innermost radial surface 712, an inner radial surface 714, a radially outermost surface 716, and an outer radial surface 718. The bottom surface 709 extends radially from the inner radial surface 714 to the tapered bottom surface 710. In an embodiment, the bottom surface 709 extends horizontally. An inner bottom surface 720 of the PEZ ring 700 extends radially outward from the innermost radial surface 712 to the inner radial surface 714. A radially outer top surface 722 of the PEZ ring 700 extends radial inward from the radially outermost surface 716 to the outer radial surface 718. Corners between the stated surfaces may be rounded as shown. The inner bottom surface 720 and the inner radial surface 714 form a notch that receives a portion (or flange), such as the flange 223 shown in FIG. 4. The PEZ ring 700 sits on the flange. The outer radial surface 718 and the top surface 722 form a channel with an opposing ring, such as ring 230 of FIG. 4, through which process gases flow. The process gases flow along the outer radial surface 718, the top surface 722 and the radially outermost surface 716 and are directed down toward an outer periphery of the wafer 206.

The recessed section 704 includes a recessed surface 724. The depth D1' of the recessed section 704 remains the same from a radially innermost edge 744 to the radially outermost edge 746 and/or radially outermost surface 716. The depth D1' is thus non-varying and may be measured at a radial cross-section of the PEZ ring 700 from (i) a reference line 747 to (ii) the recessed surface 724. The cross-section of the PEZ ring 700 is taken perpendicular to the uppermost surface 708 and the bottom (or bottommost) surface 709, such as the cross-section at the line C-C of FIG. 7. The reference line 747 is parallel to and includes a tangential intersection line, which is provided by a tangential intersection of a flat reference plane extending tangential to the tapered bottom surface 710 at the cross-section.

In an embodiment, a profile (or shape) of the PEZ ring notch 702 when viewed from the bottom of the PEZ ring 700, matches a profile (or shape) of the wafer notch 204. In the example shown, the PEZ ring notch 702 and the wafer notch 204 are V-shaped. The PEZ ring notch 702 is larger, but has dimensions that are proportional to that of the wafer notch 204. The PEZ ring notch 702 may have a curved inner portion (or surface) 750 and two laterally extending surfaces 752, 754 that extend from the curved inner portion 750 to the radially outermost edge 746. The curved inner portion 750 and the laterally extending surfaces 752, 754 correspond respectively to the curved inner portion 260 and laterally extending edges 262, 264 of the wafer notch 204 shown in FIG. 3. A width W7 of the recessed section 704 is shown and is measured at the radially outermost edge 746 and is proportional to the width W2 (shown in FIG. 3) of the wafer notch 204. The top edges of the surfaces 750, 752, 754 may be rounded.

An angle α exists between (i) a lateral line 800 extending from and parallel to the bottom surface 709 and (ii) the tapered bottom surface 710. An angle β exists between the lateral line 800 and the recessed surface 724. As an example, the angle α may be 15-25° and the angle β may equal to or within a predetermined range of the angle α. In this example, the recessed surface 724 is parallel to the tapered bottom surface 710. The angles α, β may be other acute angles. The radially innermost edge 744 of the recessed section 704 is a predetermined distance D6 from the bottom surface 709. The distance D6 may be adjusted thereby adjusting a width W8 of the recessed section 704. Each of the distance D6 and the width W8 varies in an azimuthal direction along the PEZ ring notch 702.

A distance A exists vertically between the radially outermost edge 302 of the wafer 206 and the tapered bottom surface 710. A distance B exists between the recessed surface 724 and the radially innermost edge 304 of the wafer notch 204. In one embodiment, the distance B is equal to the distance A. A gap G exists between the bottom surface 709 and the wafer 206. The vertices 804, 806 of the angles α, β are at different points. The vertex 804 is a predetermined distance D7 from the radially outermost edge 302 of the wafer 206. The vertex 804 is a predetermined distance D8 from the radially outermost surface 716 of the PEZ ring 700. In the example shown, the radially outermost edge 302 and the radially innermost edge 304 of the wafer 206 are under the recessed surface 724.

The recessed section 704 increases etch and deposition rates radially inward of the radially outermost edge 302 to allow the amount of etching and depositing to be maintained at a constant rate from an radially outermost edge 302 of the wafer 206 to at least twice a radial depth RD of the wafer notch 204 from the radially outermost edge 302. RD' represents a distance from the radial depth RD to a point below the radially innermost edge 744 of the recessed section 704, which may be greater than or equal to the radial depth RD. As an example, the radial depth RD may be 1.0-2.0 mm.

In one embodiment, the taper angle α is determined based on processing requirement, such as etch rates or deposition rates near an edge or outer periphery of a wafer. By having the bottom surface of the PEZ ring 700 tapered as shown, a minimal and/or gradual change in etch rates and deposition rates from the radially outermost edge 302 of the wafer 206 radially inward is provided. Angle β may be determined as shown in FIG. 8 based on the processing requirements, the taper angle α, the distance A, the radius of the radially innermost edge 304 of the wafer notch 204, the radius of the radially outermost edge of the bottom surface 709, and/or radius of the radially innermost edge at point 804 of the tapered bottom surface 710. In one embodiment, the angle β is equal to the angle α. The recessed section 704 is then formed based on these determined parameters.

The radially outermost surface 716 is radially outward of the radially outermost edge 302 of the wafer 206. The outermost edge of bottom surface 709 and radially innermost edge 744 of recessed section 704 are radially inward of the wafer notch 204. The substrate support 106 of FIG. 1 is configured to hold the wafer 206 relative to the PEZ ring 700 such that the wafer notch 204 is below and aligned with the PEZ ring notch 702. The whole wafer notch 204 is positioned below the recessed section 704.

The PEZ ring notches disclosed herein provide gradual etch and deposition profile control of plasma diffusion at and near a wafer notch for more uniform etch and deposition performance at and around the wafer notch. This includes providing a gradual change in plasma from an outermost edge of a wafer radially inward at the wafer notch instead of a sharp change in plasma diffusion. This is unlike a PEZ ring having a non-tapered and non-notched base, where there is a sharp drop in plasma diffusion from an outer edge of a wafer radially inward.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from multiple fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system comprising:
a substrate; and
a plasma-exclusion-zone ring comprising:
a ring-shaped body,
an upper portion of the ring-shaped body defining
a radially inner surface, and
a top surface,
a base of the ring-shaped body defining
a radially outer surface,
a first bottom surface extending radially inward from the radially outer surface, and
a second bottom surface extending radially inward from the first bottom surface,
wherein the first bottom surface is tapered and extends at an acute angle from the second bottom surface to the radially outer surface, and
a plasma-exclusion-zone ring notch that is V-shaped in a radial direction and at least one of i) has dimensions which are proportional to respective dimensions of an alignment notch of the substrate, and ii) is configured to extend over, oppose and be aligned with the alignment notch of the substrate.

2. The substrate processing system of claim 1, wherein the base comprises the plasma-exclusion-zone ring notch.

3. The substrate processing system of claim 1, wherein the plasma-exclusion-zone ring notch has a same profile as the alignment notch of the substrate.

4. The substrate processing system of claim 1, wherein the plasma-exclusion-zone ring notch is configured to increase an amount of etching or deposition at or near the alignment notch of the substrate.

5. The substrate processing system of claim 1, wherein the plasma-exclusion-zone ring notch extends radially inward from the radially outer surface and the first bottom surface.

6. The substrate processing system of claim 5, wherein the plasma-exclusion-zone ring notch comprises a single recessed surface configured to oppose the substrate.

7. The substrate processing system of claim 6, wherein the plasma-exclusion-zone ring notch has varying depth from a radially innermost edge of the plasma-exclusion-zone ring notch to a radially outermost edge of the plasma-exclusion-zone ring notch.

8. The substrate processing system of claim 6, wherein the plasma-exclusion-zone ring notch has a non-varying depth from a radially innermost edge of the plasma-exclusion-zone ring notch to a radially outermost edge of the plasma-exclusion-zone ring notch.

9. The substrate processing system of claim 5, wherein:
the plasma-exclusion-zone ring notch comprises a plurality of recessed surfaces; and
one of the plurality of recessed surfaces extending from the radially outer surface and recessed relative to the first bottom surface.

10. The substrate processing system of claim 9, wherein the plurality of recessed surfaces comprise:
a first recessed surface extending at an acute angle relative to the second bottom surface; and
a second recessed surface extending parallel to the second bottom surface.

11. The substrate processing system of claim 1, wherein:
the upper portion and the base form a radially-inner stepped surface; and
the radially-inner stepped surface (i) sits on and receives a flange of a dielectric component, and (ii) faces a radially outer surface of the dielectric component.

12. The substrate processing system of claim 11, further comprising the dielectric component,
wherein the plasma-exclusion-zone ring is in contact with the dielectric component.

13. The substrate processing system of claim 12, wherein the plasma-exclusion-zone ring is fused to the dielectric component.

14. The substrate processing system of claim 12, wherein the plasma-exclusion-zone ring and the dielectric component are integrally formed as a single component.

15. The substrate processing system of claim 1, wherein
the upper portion and the base form a radially-inner stepped surface disposed radially inward of a radial outer portion of the first bottom surface; and
the radially-inner stepped surface extends inwardly into the ring-shaped body between the radially inner surface and the second bottom surface.

16. The substrate processing system of claim 1, wherein the plasma-exclusion-zone ring comprises only a single plasma-exclusion-zone ring notch.

17. The substrate processing system of claim 1, wherein:
the plasma-exclusion-zone ring notch comprises a recessed top surface; and
the recessed top surface is disposed inward from the first bottom surface.

18. The substrate processing system of claim 1, wherein:
the plasma-exclusion-zone ring comprises only a single plasma-exclusion-zone ring notch; and
the plasma-exclusion-zone ring notch comprises a recessed top surface.

19. A substrate processing system comprising:
a substrate; and
a plasma-exclusion-zone ring comprising
a ring-shaped body,
an upper portion of the ring-shaped body defining
a radially inner surface, and
a top surface,
a base of the ring-shaped body defining
a radially outer surface that guides processing gas towards a peripheral edge of the substrate,
a first bottom surface extending radially inward from the radially outer surface, and
a second bottom surface extending radially inward from the first bottom surface,
wherein the first bottom surface is tapered and extends at an acute angle from the second bottom surface to the radially outer surface, and
a plasma-exclusion-zone ring notch that is V-shaped in a radial direction and at least one of i) has dimensions which are proportional to respective dimensions of an alignment notch of the substrate, and ii)

is configured to extend over, oppose and be aligned with the alignment notch of the substrate.

20. The substrate processing system of claim 19, wherein the plasma-exclusion-zone ring notch has a same profile as the alignment notch of the substrate.

21. The substrate processing system of claim 16, wherein the plasma-exclusion-zone ring is disposed above the substrate.

22. The substrate processing system of claim 16, further comprising a substrate support configured to support the substrate, wherein the plasma-exclusion-zone ring is disposed above the substrate support.

23. A substrate processing system comprising:

a substrate; and a plasma-exclusion-zone ring comprising:

a ring-shaped body defining a radially inner surface, a radially outer surface, a top surface extending radially outward from the radially inner surface, a first bottom surface extending radially inward from the radially outer surface, and a second bottom surface extending radially inward from the first bottom surface, wherein the second bottom surface is at a different angle than the first bottom surface, and a plasma-exclusion-zone ring notch extending inwardly into the ring-shaped body from the radially outer surface and the first bottom surface, wherein the plasma-exclusion-zone ring notch at least one of i) has dimensions that are proportional to respective dimensions of an alignment notch of the substrate, and ii) is configured to extend over, oppose and be aligned with the alignment notch of the substrate, and wherein the plasma-exclusion-zone ring notch comprises a first recessed surface extending radially inward from the radially outer surface.

24. The substrate processing system of claim 23, wherein the first bottom surface is tapered and extends at an acute angle from the second bottom surface to the radially outer surface.

25. The substrate processing system of claim 23, wherein the plasma-exclusion-zone ring notch comprises a single recessed surface configured to oppose the alignment notch of the substrate.

26. The substrate processing system of claim 23, wherein the plasma-exclusion-zone ring notch has varying depth from a radially innermost edge of the plasma-exclusion-zone ring notch to a radially outermost edge of the plasma-exclusion-zone ring notch.

27. The substrate processing system of claim 23, wherein the plasma-exclusion-zone ring notch has a non-varying depth from a radially innermost edge of the plasma-exclusion-zone ring notch to a radially outermost edge of the plasma-exclusion-zone ring notch.

28. The substrate processing system of claim 23, wherein:

the plasma-exclusion-zone ring notch comprises a second recessed surface;

the first recessed surface extends at an acute angle relative to the second bottom surface;

the second recessed surface extends parallel to the second bottom surface; and at least one of the first recessed surface and the second recessed surface is configured to oppose the alignment notch of the substrate.

29. The substrate processing system of claim 28, wherein the first recessed surface and the second recessed surface are planar surfaces.

30. The substrate processing system of claim 23, further comprising: a dielectric component, wherein the radially inner surface is in contact with a radially outer surface of the dielectric component.

31. The substrate processing system of claim 30, wherein the plasma-exclusion-zone ring is fused to the dielectric component.

32. The substrate processing system of claim 30, wherein the plasma-exclusion-zone ring and the dielectric component are integrally formed as a single component.

33. The substrate processing system of claim 23, wherein the plasma-exclusion-zone ring notch has a linearly varying depth from a radially innermost edge of the plasma-exclusion-zone ring notch to a radially outermost edge of the plasma-exclusion-zone ring notch.

34. The substrate processing system of claim 23, wherein the first recessed surface is at an acute angle relative to the second bottom surface.

35. The substrate processing system of claim 34, wherein the first recessed surface extends parallel to the first bottom surface and is recessed into the plasma-exclusion-zone ring relative to the first bottom surface.

36. The substrate processing system of claim 35, wherein a portion of the first bottom surface is between the plasma-exclusion-zone ring notch and the second bottom surface.

37. The substrate processing system of claim 23, wherein the first recessed surface of the plasma-exclusion-zone ring notch extends inward of the first bottom surface.

38. The substrate processing system of claim 23, wherein:

the plasma-exclusion-zone ring comprises only a single plasma-exclusion-zone ring notch; and the plasma-exclusion-zone ring notch is V-shaped in a radial direction.

* * * * *